(12) United States Patent
Thayer et al.

(10) Patent No.: US 7,143,818 B2
(45) Date of Patent: Dec. 5, 2006

(54) HEAT PIPE EVAPORATOR WITH POROUS VALVE

(75) Inventors: John Gilbert Thayer, Lancaster, PA (US); Donald M. Ernst, Lancaster, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 11/337,407

(22) Filed: Jan. 23, 2006

(65) Prior Publication Data

US 2006/0144564 A1 Jul. 6, 2006

Related U.S. Application Data

(63) Continuation of application No. 10/930,018, filed on Aug. 30, 2004, now Pat. No. 7,013,956.

(60) Provisional application No. 60/499,483, filed on Sep. 2, 2003, provisional application No. 60/502,125, filed on Sep. 11, 2003.

(51) Int. Cl.
   *F28D 15/04* (2006.01)
(52) U.S. Cl. .............................. 165/104.26; 165/104.21
(58) Field of Classification Search ........... 165/104.21, 165/104.25, 104.26, 41, 104.33, 185; 361/699, 361/700; 257/714–716; 174/15.2
See application file for complete search history.

(56) References Cited

U.S. PATENT DOCUMENTS

| | | | |
|---|---|---|---|
| 3,404,730 A * | 10/1968 | Kurisu | 165/104.33 |
| 3,414,050 A * | 12/1968 | Anand | 165/104.26 |
| 3,543,839 A * | 12/1970 | Shlosinger | 165/104.26 |
| 4,037,830 A | 7/1977 | Poluzzi et al. | |
| 4,213,698 A | 7/1980 | Firtion et al. | |
| RE31,053 E | 10/1982 | Firtion et al. | |
| 4,551,192 A | 11/1985 | Di Milia et al. | |
| 4,609,037 A | 9/1986 | Wheeler et al. | |
| 4,784,213 A | 11/1988 | Eager et al. | |
| 5,001,423 A | 3/1991 | Abrami et al. | |
| 5,084,671 A | 1/1992 | Miyata et al. | |
| 5,382,311 A | 1/1995 | Ishikawa et al. | |
| 5,383,971 A | 1/1995 | Selbrede | |
| 5,435,379 A | 7/1995 | Moslehi et al. | |
| 5,458,687 A | 10/1995 | Shichida et al. | |
| 5,460,684 A | 10/1995 | Saeki et al. | |
| 5,474,877 A | 12/1995 | Suzuki | |
| 5,478,609 A | 12/1995 | Okamura | |
| 5,534,073 A | 7/1996 | Kinoshita et al. | |
| 5,588,827 A | 12/1996 | Muka | |
| 5,610,529 A | 3/1997 | Schwindt | |
| 5,663,653 A | 9/1997 | Schwindt et al. | |
| 5,721,090 A | 2/1998 | Okamoto et al. | |
| 5,725,049 A * | 3/1998 | Swanson et al. | 165/104.26 |
| 5,730,803 A | 3/1998 | Steger et al. | |
| 5,738,165 A | 4/1998 | Imai | |
| 5,762,714 A | 6/1998 | Mohn et al. | |
| 5,820,723 A | 10/1998 | Benjamin et al. | |
| 5,830,808 A | 11/1998 | Chapman | |
| 5,885,353 A | 3/1999 | Strodtbeck et al. | |
| 5,904,776 A | 5/1999 | Donde et al. | |
| 5,904,779 A | 5/1999 | Dhindsa et al. | |

(Continued)

Primary Examiner—Teresa J. Walberg
(74) Attorney, Agent, or Firm—Duane Morris LLP

(57) ABSTRACT

An evaporator includes an enclosure having a fluid inlet manifold and a vapor outlet manifold. At least one blind passageway is arranged within the enclosure so as to open into a portion of the vapor outlet manifold. The interior surface of the enclosure that defines each passageway is covered with a capillary wick. A porous valve is arranged in fluid communication between the fluid inlet manifold and a blind end of the at least one blind passageway.

7 Claims, 7 Drawing Sheets

U.S. PATENT DOCUMENTS

| | | |
|---|---|---|
| 5,958,140 A | 9/1999 | Arami et al. |
| 6,032,724 A | 3/2000 | Hatta |
| 6,037,793 A | 3/2000 | Miyazawa et al. |
| 6,073,681 A | 6/2000 | Getchel et al. |
| 6,245,202 B1 | 6/2001 | Edamura et al. |
| 6,313,649 B1 | 11/2001 | Harwood et al. |
| 6,394,797 B1 | 5/2002 | Sugaya et al. |
| 6,471,913 B1 | 10/2002 | Weaver et al. |
| 6,583,638 B1 | 6/2003 | Costello et al. |
| 6,771,086 B1 | 8/2004 | Lutz et al. |

* cited by examiner

HEAT PIPE EVAPORATOR WITH POROUS VALVE

CROSS-REFERENCE TO RELATED APPLICATIONS

This application is a continuation application of U.S. application Ser. No. 10/930,018, filed Aug. 30, 2004, now U.S. Pat. No. 7,013,956 which itself claims the benefit of U.S. Provisional Patent Application No. 60/499,483, filed Sep. 2, 2003 and U.S. Provisional Patent Application No. 60/502,125, filed Sep. 11, 2003.

FIELD OF THE INVENTION

The present invention generally relates to evaporators for use in thermal management systems, and more particularly to evaporators utilizing two-phase coolants.

BACKGROUND OF THE INVENTION

It has been suggested that a computer is a thermodynamic engine that sucks entropy out of data, turns that entropy into heat, and dumps the heat into the environment. The ability of prior art thermal management technology to get that waste heat out of semiconductor circuits and into the environment, at a reasonable cost, limits the density and clock speed of electronic systems.

A typical characteristic of heat transfer devices for electronic systems is that a semiconductor chip often thermally contacts a passive heat spreader plate, which conducts the heat from the chip to the evaporator of one of several types heat transfer devices, and then on into the atmosphere. As the power to be dissipated by semiconductor devices increases with time, a problem arises: over time the thermal conductivity of the available materials becomes too low to conduct the heat from the semiconductor device to the atmosphere with an acceptably low temperature drop. The thermal power density emerging from the semiconductor devices will be so high that even copper or silver spreader plates will not be adequate.

Thermal energy can sometimes be transported by an intermediate loop of recirculating fluid; heat from the hot object is conducted into a heat transfer fluid, the fluid is pumped by some means to a different location, and there the heat is conducted out of the fluid into the atmosphere. For example, thermosyphons use a change in density of the heat transfer fluid to impel circulation of the fluid, while heat pipes and boiling fluorocarbons use a phase transition in the heat transfer fluid to impel circulation of the fluid. While these approaches have important cooling applications, their cost for implementation will have to be reduced to generally impact semiconductor cooling.

Another technology that has proven beneficial is the heat pipe. A heat pipe includes a sealed envelope that defines an internal chamber containing a capillary wick and a working fluid capable of having both a liquid phase and a vapor phase within a desired range of operating temperatures. When one portion of the chamber is exposed to relatively high temperature it functions as an evaporator section. The working fluid is vaporized in the evaporator section causing a slight pressure increase forcing the vapor to a relatively lower temperature section of the chamber, defined as a condenser section. The vapor is condensed in the condenser section and returns through the capillary wick to the evaporator section by capillary pumping action. Because a heat pipe operates on the principle of phase changes rather than on the principles of conduction or convection, a heat pipe is theoretically capable of transferring heat at a much higher rate than conventional heat transfer systems. Consequently, heat pipes have been utilized to cool various types of high heat-producing apparatus, such as electronic equipment (See, e.g., U.S. Pat. Nos. 5,884,693, 5,890,371, and 6,076,595).

Electronic systems must not only be cooled during their working life, but also during initial packaging, and testing prior to use in a commercial product. In many testing applications, the tests must be performed at elevated temperatures. Automated test systems are commonly outfitted with temperature control systems which can control the temperature of the device or devices under test. For example, and referring to FIG. 5, a semiconductor device test system A often includes a temperature-controlled semiconductor device support platform B that is mounted on a prober stage C of prober station D. A top surface E of the device support platform B supports a semiconductor device F and incorporates conventional vacuum line openings and grooves G facilitating secure holding of semiconductor device F in position on top surface E of device support platform B. A system controller is provided to control the temperature of device support platform B. A cooling system I is provided to help regulate the temperature of device support platform B. A user interface is provided in the form of a touch-screen display J where, for example, a desired temperature for the top of support platform B can be input. Temperature controlled systems for testing semiconductor devices during burn-in are well known, as disclosed in the following patents which are hereby incorporated by herein by reference: U.S. Pat. Nos. 4,037,830, 4,213,698, RE31053, U.S. Pat. Nos. 4,551,192, 4,609,037, 4,784,213, 5,001,423, 5,084,671, 5,382,311, 5,383,971, 5,435,379, 5,458,687, 5,460,684, 5,474,877, 5,478,609, 5,534,073, 5,588,827, 5,610,529, 5,663,653, 5,721,090, 5,730,803, 5,738,165, 5,762,714, 5,820,723, 5,830,808, 5,885,353, 5,904,776, 5,904,779, 5,958,140, 6,032,724, 6,037,793, 6,073,681, 6,245,202, 6,313,649, 6,394,797, 6,471,913, 6,583,638, and 6,771,086.

None of the foregoing technologies or devices has proved to be entirely satisfactory.

SUMMARY OF THE INVENTION

The present invention provides an evaporator including an enclosure having a fluid inlet manifold and a vapor outlet manifold. At least one blind passageway is arranged within the enclosure so as to open into a portion of the vapor outlet manifold. The interior surface of the enclosure that defines each passageway is covered with a capillary wick. A porous valve is arranged in fluid communication between the fluid inlet manifold and a blind end of the at least one blind passageway.

In another embodiment of the invention an evaporator is provided that includes an enclosure having a fluid inlet manifold and a vapor outlet manifold arranged in substantially parallel spaced relation within the enclosure. A plurality of blind passageways are provided that each open into a portion of the vapor outlet manifold. A capillary wick covers the interior surfaces of the evaporator that define each of the passageways. A plurality of porous valves are arranged in fluid communication between the fluid inlet manifold and a blind end of each one of the plurality of blind passageways.

A thermal management system is also provided that includes at least one evaporator comprising an enclosure having a fluid inlet manifold and a vapor outlet manifold. At least one blind passageway is defined within the enclosure that opens into a portion of the vapor outlet manifold. The interior surfaces of the enclosure that define each passageway are covered with a capillary wick. A porous valve is arranged in fluid communication between the fluid inlet manifold and a blind end of each blind passageway that is provided in the enclosure. A condenser assembly is also provided that has an inlet opening arranged in flow communication with the vapor outlet manifold of the at least one evaporator and an outlet opening arranged in fluid communication with the fluid inlet manifold of the at least one evaporator. A pump is operatively positioned between the fluid inlet manifold and the outlet opening so as to force a coolant liquid into the inlet manifold at a predetermined pressure.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
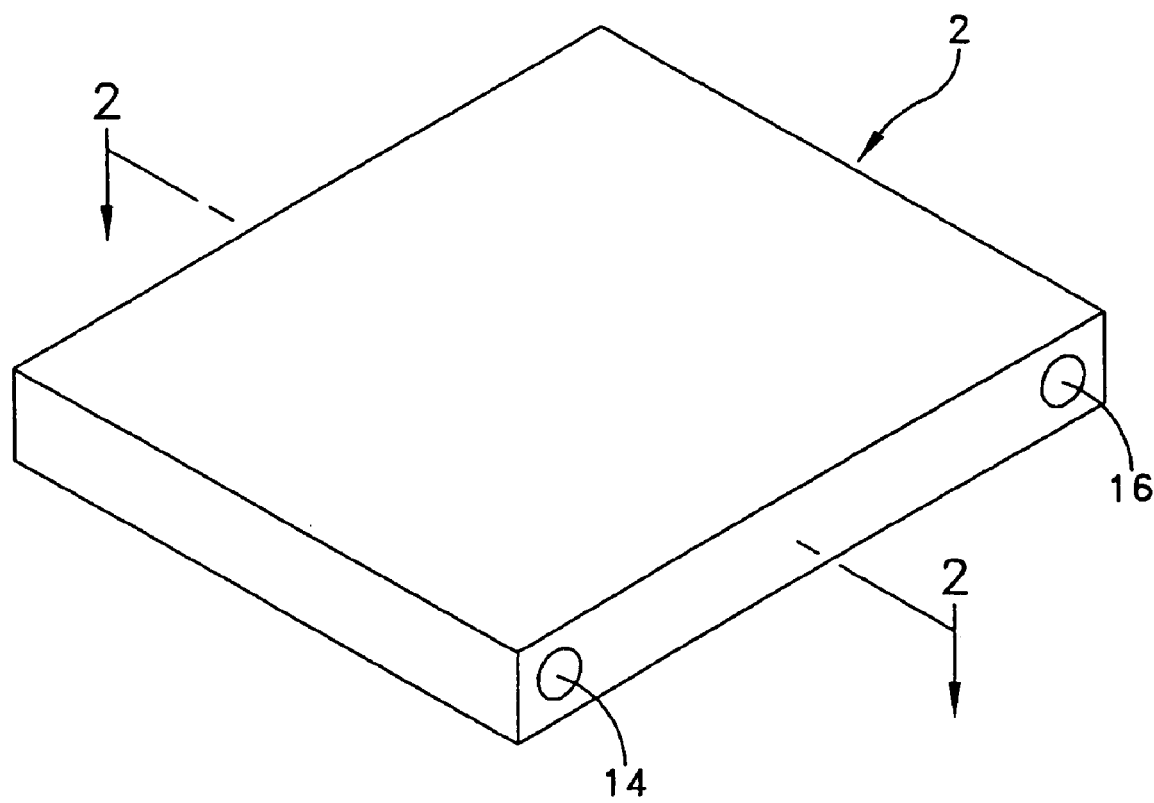
FIG. 1 is a perspective view of an evaporator formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 2:
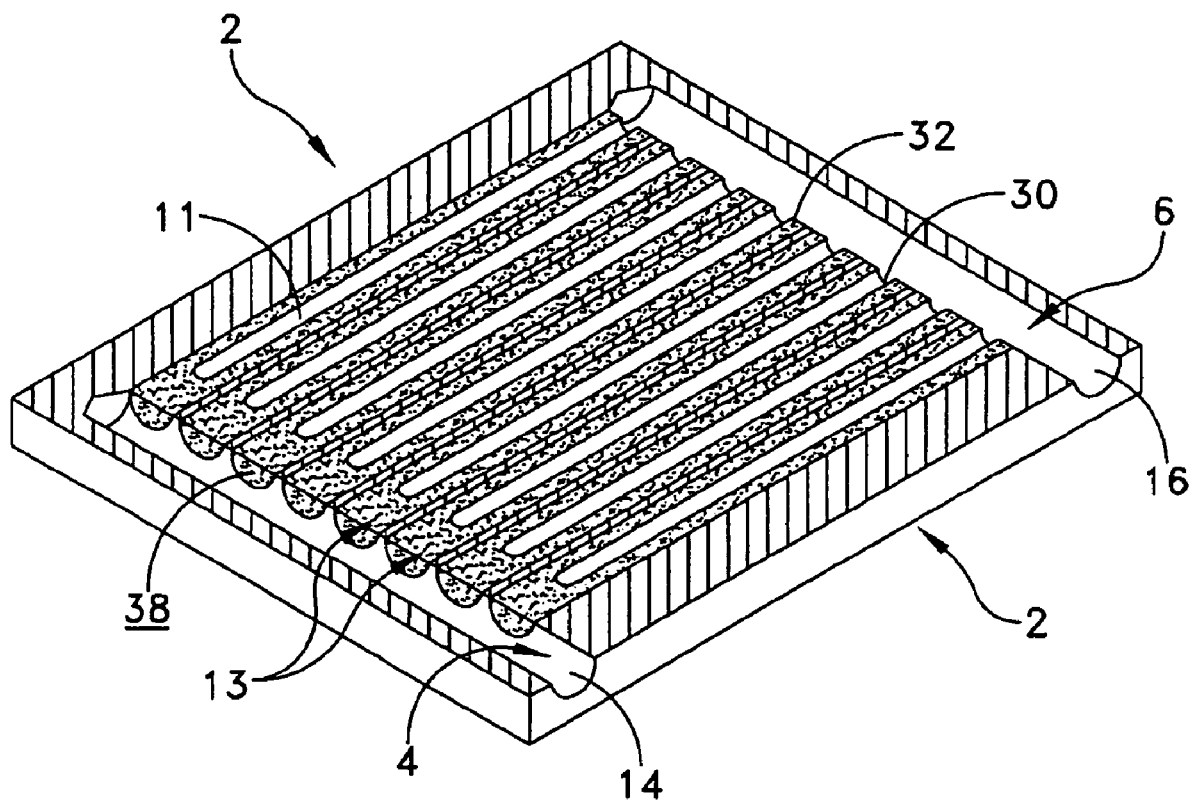
FIG. 2 is a perspective, transverse cross-sectional view of the evaporator shown in FIG. 1.
Figure 3:
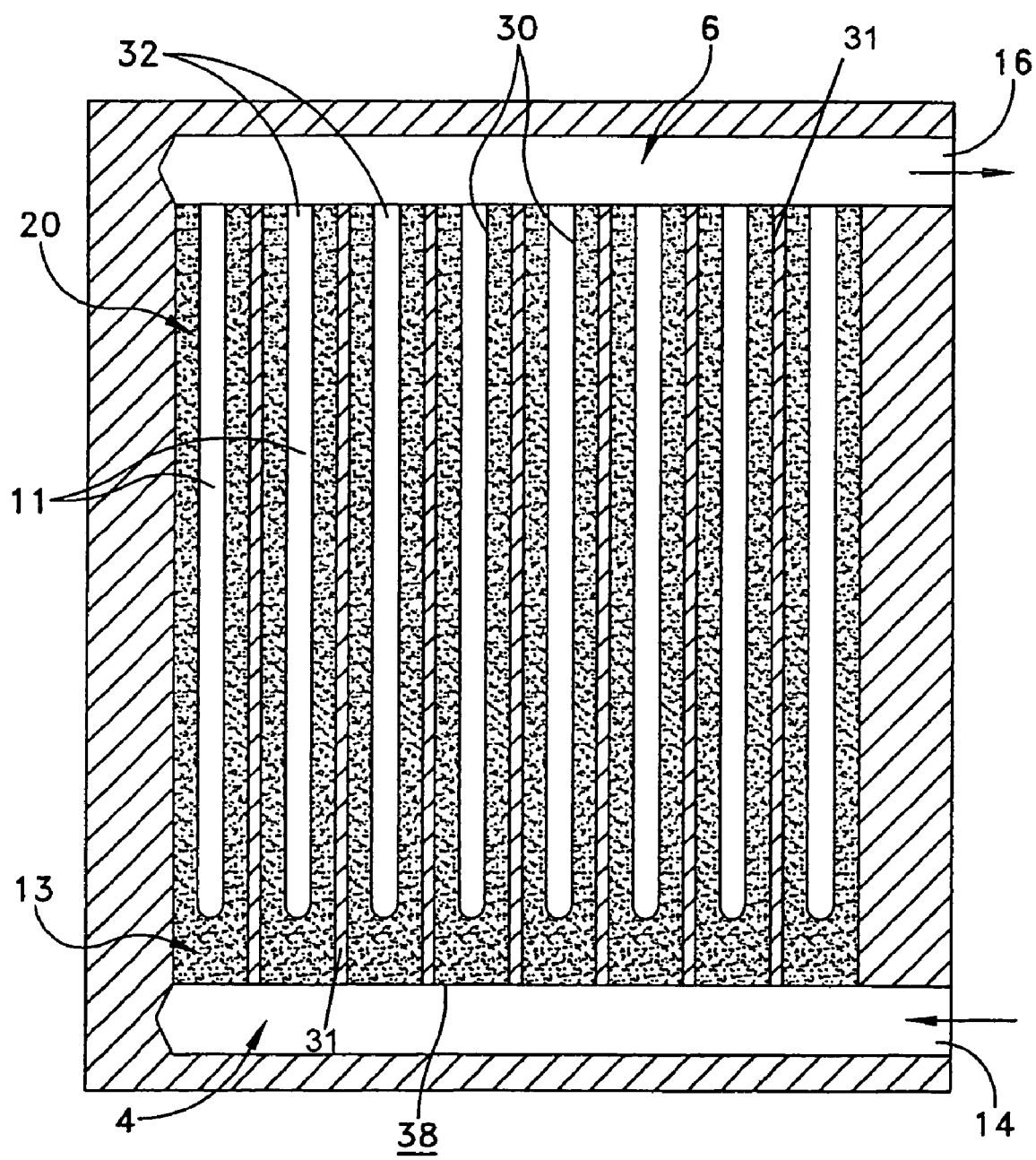
FIG. 3 is a plan view of the cross-section shown in FIG. 2.
Figure 7:
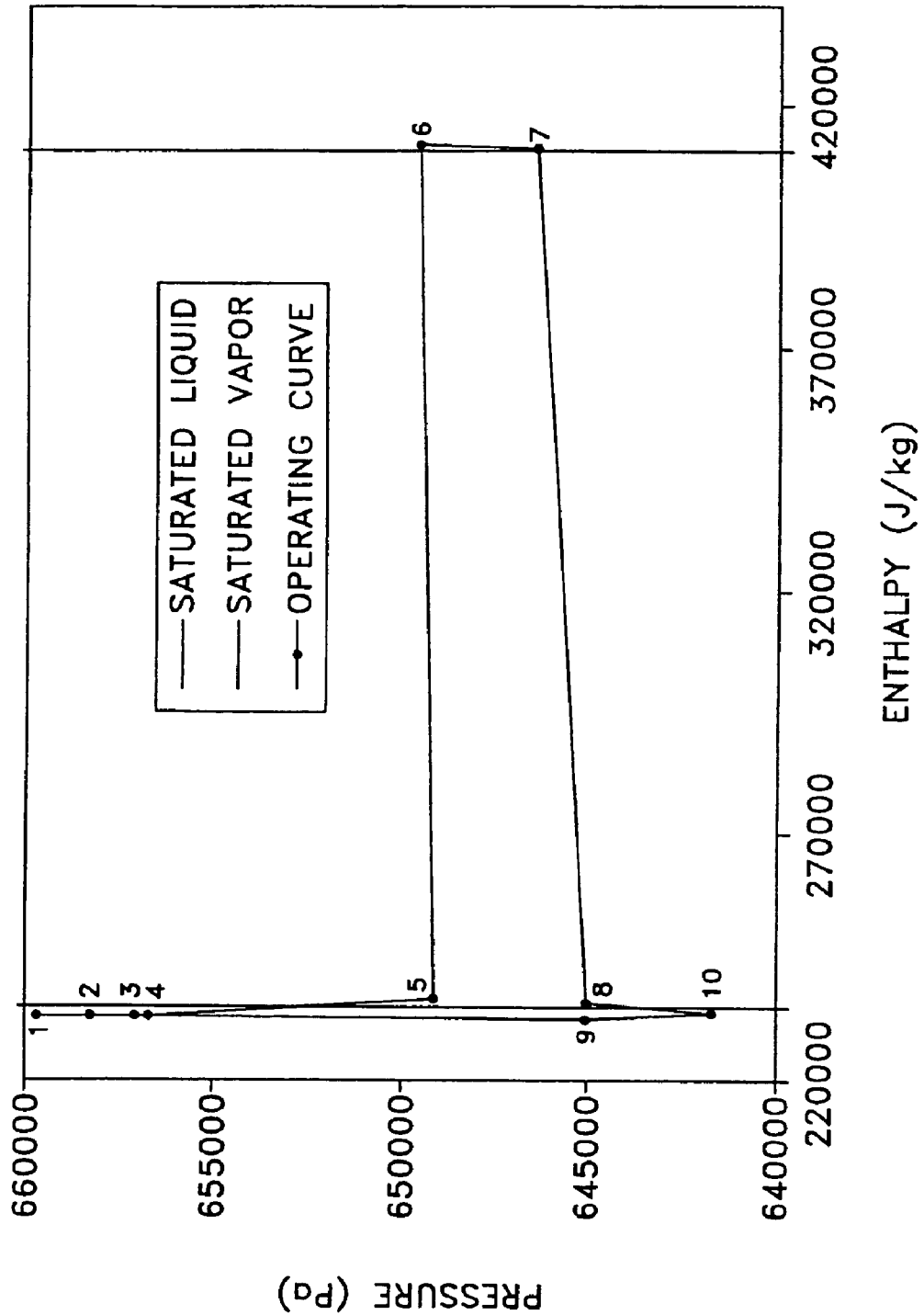
FIG. 7 is an enthalpy versus pressure diagram providing an operating curve for use in connection with the evaporator of the present invention.

Referring to FIGS. 1–3, an evaporator 2 formed in accordance with the present invention includes an inlet manifold 4, an outlet manifold 6, a plurality of blind passageways 11, and a porous valve 13. Evaporator 2 is formed in an enclosure that is formed from a highly thermally conductive material, e.g., copper or its alloys, aluminum or its alloys, or steel. An enclosure for purposes of this description will usually mean a walled or otherwise inclosed, shut up, or encompassed void (or voids) that is separated from surrounding structures by a plurality of solid dividing structures, e.g., walls. An evaporator enclosure 2 of the type used in connection with the present invention often comprises a substantially flat aspect ratio so as to complement a variety of flat heat sources, e.g., a wide variety of semiconductor devices and packages. Inlet manifold 4 and outlet manifold 6 often comprise substantially parallel blind bores that are located in spaced relation to one another within evaporator 2. An inlet opening 14 in a side surface (FIGS. 1, 2, and 3) or top surface (FIG. 8) of evaporator 2 is arranged in open flow communication with inlet manifold 4 and a condenser assembly 26, via a coolant conduit 28 (FIGS. 2, 3, and 7) and an outlet opening 16 is arranged in flow communication with outlet manifold 6 and condenser assembly 26, via vapor conduit 29.

Plurality of blind passageways 11 are often arranged in substantially parallel relation to one another, with each having an open end 30 that opens into outlet manifold 6. The portions 31 of evaporator enclosure 2 that reside between adjacent passageways 11 serve as "fins" to distribute heat to a larger surface. These structures also provide additional structural support to strengthen evaporator 2. Each passageway 11 is lined or covered with a capillary wick 32 formed on the interior surfaces of evaporator 2 that define each passageway 11. Capillary wick 32 most often comprises a sintered or brazed metal powder structure with interstices between the particles of powder. Of course, capillary wick 32 may also other wicking structures, such as, grooves, screen, cables, adjacent layers of screening, and felt. In one embodiment, capillary wick 32 may comprise sintered copper powder, sintered aluminum-silicon-carbide (AlSiC) or copper-silicon-carbide (CuSiC) having an average thickness of about 0.1 mm to 1.0 mm. A coolant fluid 35 saturates capillary wick 32 during operation of evaporator 2, and may comprise any of the well known two-phase vaporizable liquids, e.g., water, alcohol, freon, etc.

A porous valve 13 is formed within evaporator 2 so as to create the blind end of each passageway 11. Porous valve 13 comprises a plug of poriferous material, e.g., a powdered metal meshwork, that is permeable to coolant fluid 35, but at a substantially reduced rate as compared to an unobstructed portion of passageway 11. As such, porous valve 13 forms a seeping barrier to liquid coolant fluid 35 and between inlet manifold 4 and the capillary wick that lines passageway 11. In one embodiment of the invention, porous valve 13 may be formed from a sintered material, e.g., copper, with pores sized in a range from about 25 μm to about 150 μm, with pores sized in the range of 50 μm to about 80 μm being preferred for most applications using water for coolant fluid 35. The length of porous valve 13 may be set according to the flow rate through the valve that is needed to prevent drying out of capillary wick 32. Porous valve 13 is positioned within evaporator 2 so that an inlet surface 38 is in flow communication with inlet manifold 4.

Evaporator 2 is normally arranged in intimate thermal engagement with a source of thermal energy, such as an integrated circuit chip or chips F, or an electronic device comprising such chips or other heat generating structures known in the art. Multiple evaporators 2 may include external and/or internal features and structures to aid in the rapid vaporization of coolant fluid 35. For example, an externally applied thermally conductive coating may used to enhance heat transfer and spreading from the heat source throughout evaporator 2.

Figure 4:
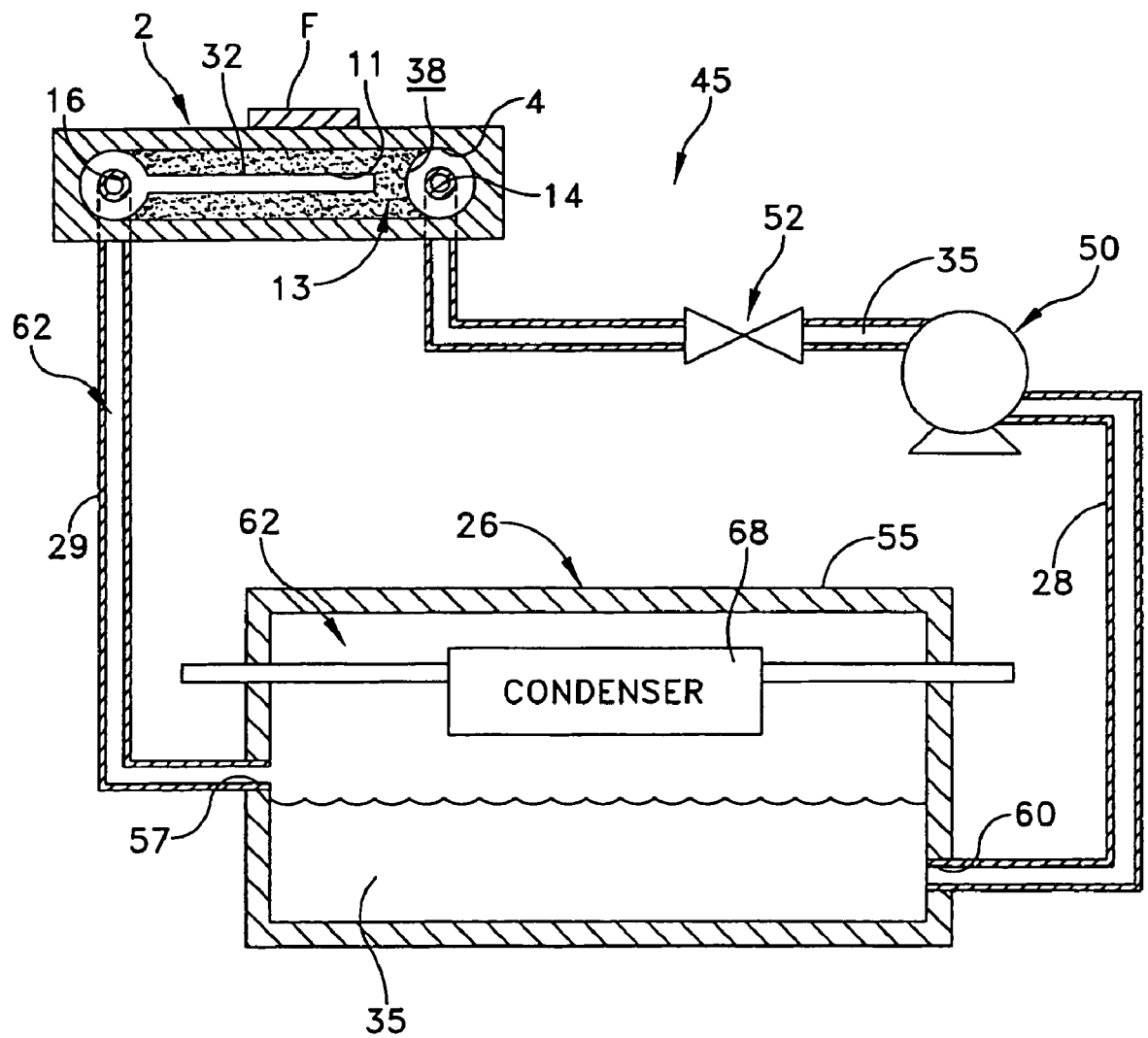
FIG. 4 is a front elevational view of a typical semiconductor device burn-in-testing station.
Figure 5:
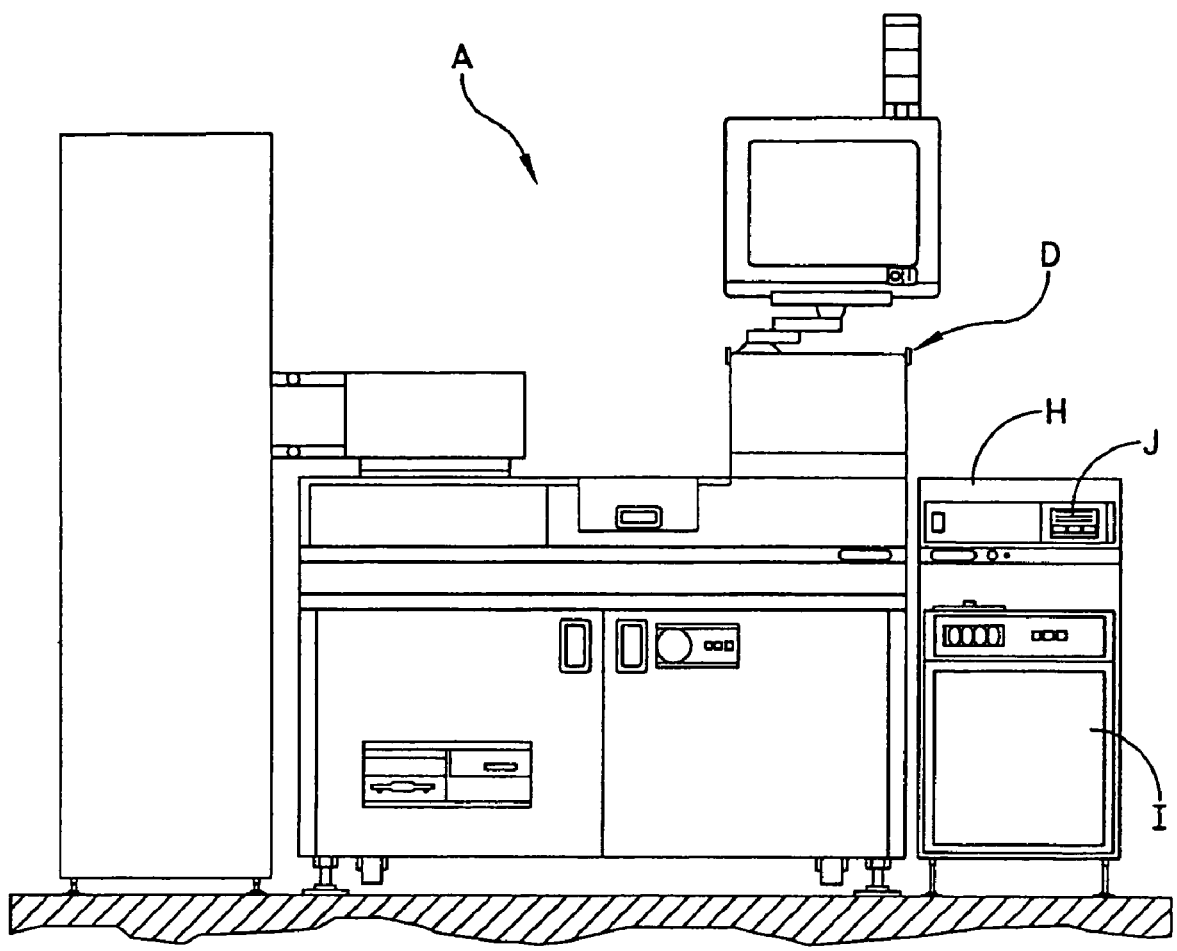
FIG. 5 is an exploded perspective view of a typical semiconductor device mounted for burn-in-testing, and positioned above an evaporator formed in accordance with the present invention.
Figure 6:
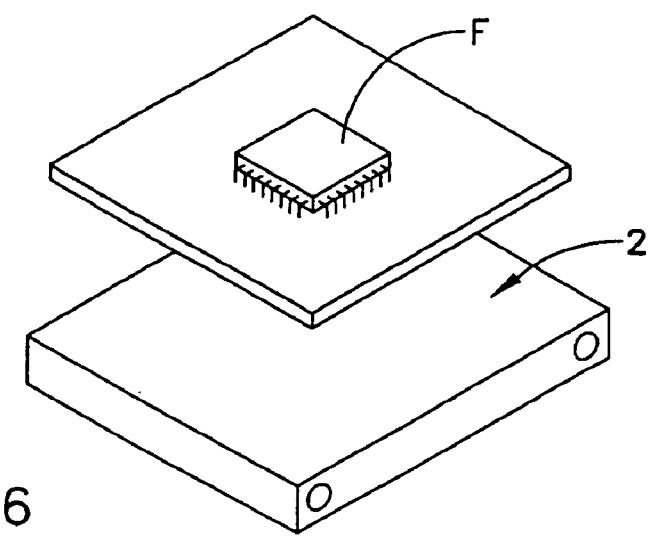
FIG. 6 is a schematic, partially cross-sectioned, representation of a cooling system utilizing an evaporator formed in accordance with the present invention.

In operation, evaporator 2 normally forms a portion of a thermal management system 45 (FIG. 4). In one embodiment, thermal management system 45 also includes a condenser assembly 26, a pump 50, and a pressure control valve 52. Condenser assembly 26 comprises a chambered enclosure 55 having an inlet opening 57 arranged in flow communication with one or more evaporators 2, via vapor conduit 29, and an outlet opening 60 arranged in flow communication with each evaporator 2 through pump 50 and pressure valve 52, via coolant conduit 28. Condenser assembly 26 acts as a heat exchanger transferring heat contained in vaporous coolant fluid 62 to the ambient surroundings or with a liquid cooled, secondary condenser 68 that is located within chambered enclosure 55, and chilled by a flowing liquid or gas, e.g., chilled water or air, from a pumped source (not shown).

Figure 8:
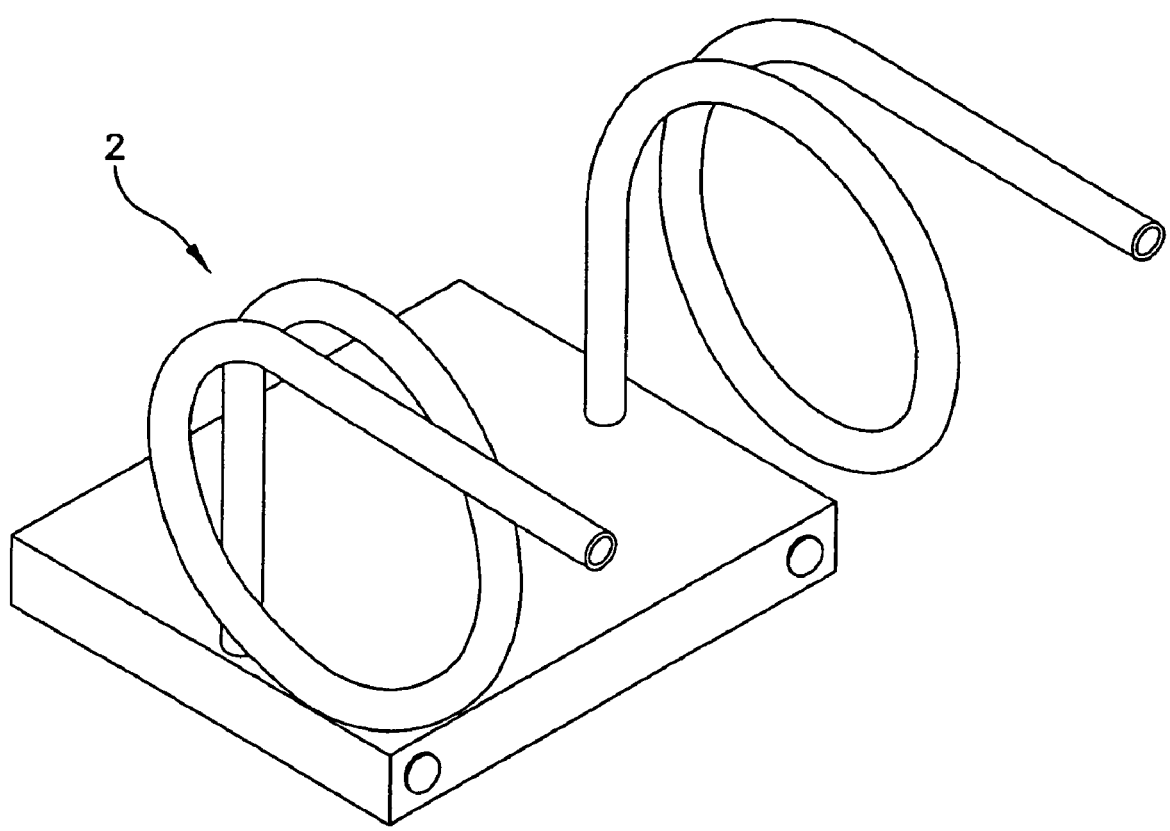
FIG. 8 is an alternative embodiment of an evaporator formed in accordance with the present invention.

Pump 50 is arranged in fluid communication between each evaporator 2 and condenser assembly 26. Pump 50 provides a continuous flow of liquid coolant 35 to the inlet manifold 4 of each evaporator 2 from condenser assembly 26. Pressure control valve 52 helps to maintain an optimum pressure level within inlet manifold 4 so as to produce a constant and continuous seepage of liquid coolant fluid 35 through porous valves 13. FIG. 8 provides a graphical representation of the preferred relationship between the seepage of liquid coolant fluid 35 through porous valves 13 as a function of coolant liquid pressure within inlet manifold 4.

As a result of this construction, each blind passageway 11 within evaporator 2 acts as a driven-heat pipe with a porous valve 13 located at one end to maintain capillary wick 32 continuously saturated with coolant liquid 35. More particularly, thermal energy is absorbed by evaporator 2 from heat source F, e.g., a semiconductor chip, by evaporation of liquid coolant 35 (within those portions of capillary wick 32 that are adjacent to heat source F) to vaporous coolant 62 inside each blind passageway 11. Advantageously, capillary wick 32 provides nucleation sites for bubble formation and retains coolant liquid 35 so that nearly pure vaporous coolant exits passageway 11 from open end 30. Vaporous coolant 62, with its absorbed heat load, is thermodynamically driven to each open end 30 due to a pressure difference created between heat source F and the heat sink formed by outlet manifold 6. As this occurs, fresh liquid coolant 35 seeps into each driven-heat pipe under a predetermined pressure head of liquid coolant provided in inlet manifold 4 by the action of pump 35. This causes liquid coolant 50 into each driven-heat pipe, via porous valve 13, so as to further wet and thereby replenish capillary wick 32 and to replace the now vaporized coolant. The heat load is rejected by vaporous coolant 62 to condenser assembly 26, with consequent condensation of vaporous coolant 62 to liquid coolant 35. Then, pump 50 forces condensed liquid coolant 35 to return to inlet manifold 4.

It is to be understood that the present invention is by no means limited only to the particular constructions herein disclosed and shown in the drawings, but also comprises any modifications or equivalents within the scope of the claims.

What is claimed is:

1. An evaporator comprising:
    an enclosure having a fluid inlet manifold and a vapor outlet manifold arranged in substantially parallel spaced relation within said enclosure;
    a plurality of blind passageways that each open into a portion of said vapor outlet manifold and have a capillary wick covering the interior surfaces of said evaporator that define each of said passageways; and
    a plurality of porous valves, one being arranged in fluid communication between said fluid inlet manifold and a blind end of each one of said plurality of blind passageways.

2. An evaporator according to claim 1 wherein said capillary wick comprises a porous internal surface coating deposited on the interior surfaces of said enclosure that define said plurality of blind passageways.

3. An evaporator according to claim 1 wherein said capillary wick comprises a sintered powder.

4. An evaporator according to claim 1 wherein said capillary wick receives coolant fluid through said porous valve thereby continuously saturating a portion of said capillary wick.

5. An evaporator according to claim 1 wherein said capillary wick comprises a structure selected from the group consisting of grooves, screen, cables, adjacent layers of screening, felt, and sintered powders.

6. An evaporator according to claim 1 comprising an internal fin structure disposed adjacent said at least one blind passageway.

7. An evaporator comprising:
    an enclosure having a fluid inlet manifold and a vapor outlet manifold arranged in substantially parallel spaced relation within said enclosure;
    a plurality of blind passageways that each open into a portion of said vapor outlet manifold and are lined with a capillary wick; and
    a plurality of porous valves, one being arranged in fluid communication between said fluid inlet manifold and that portion of said capillary wick located at a blind end of each one of said plurality of blind passageways.

* * * * *